(12) United States Patent
Koike et al.

(10) Patent No.: US 10,355,147 B2
(45) Date of Patent: Jul. 16, 2019

(54) SOLAR CELL MODULE AND METHOD FOR MANUFACTURING THE SAME

(71) Applicant: Material Concept, Inc., Sendai-shi, Miyagi (JP)

(72) Inventors: Junichi Koike, Sendai (JP); Yuji Sutou, Sendai (JP); Daisuke Ando, Sendai (JP); Makoto Wada, Sendai (JP)

(73) Assignee: MATERIAL CONCEPT, INC., Miyagi (JP)

( * ) Notice: Subject to any disclaimer, the term of this patent is extended or adjusted under 35 U.S.C. 154(b) by 0 days.

(21) Appl. No.: 15/539,430

(22) PCT Filed: Dec. 17, 2015

(86) PCT No.: PCT/JP2015/085301
§ 371 (c)(1),
(2) Date: Jun. 23, 2017

(87) PCT Pub. No.: WO2016/104304
PCT Pub. Date: Jun. 30, 2016

(65) Prior Publication Data
US 2018/0013024 A1    Jan. 11, 2018

(30) Foreign Application Priority Data
Dec. 26, 2014 (JP) .................. 2014-266406

(51) Int. Cl.
*H01L 31/18* (2006.01)
*H01L 31/048* (2014.01)
(Continued)

(52) U.S. Cl.
CPC .. *H01L 31/02167* (2013.01); *H01L 31/02168* (2013.01); *H01L 31/022466* (2013.01);
(Continued)

(58) Field of Classification Search
CPC ......... H01L 31/02167; H01L 31/02168; H01L 31/048; H01L 31/0481; H01L 31/0488; H01L 31/022466; Y02E 10/50
See application file for complete search history.

(56) References Cited

U.S. PATENT DOCUMENTS 5,411,601 A    5/1995  Higuchi et al.
7,786,375 B2   8/2010  Swanson et al.
(Continued)

FOREIGN PATENT DOCUMENTS

CN       102655178 A      9/2012
DE    102011008269 A1     7/2012
(Continued)

OTHER PUBLICATIONS

E. Aubry et al, "Effect of NA diffusion from glass substrate on the microstructural and photocatalytic properties of post-annealed TiO2 films synthesised by reactive sputtering," Surface & Coatings Technology; 2012, pp. 4999-5005.
(Continued)

*Primary Examiner* — Lindsey A Bernier
(74) *Attorney, Agent, or Firm* — Cantor Colburn LLP

(57) ABSTRACT

A solar cell module capable of preventing the occurrence of a PID failure in a solar photovoltaic power generation system with a MW capacity, said system being used in a high-temperature high-humidity environment; and a method for manufacturing this solar cell module. A solar cell module which comprises a protection glass material and a sealing material on a light receiving surface side of a substrate, and which also comprises an oxide layer between the substrate and the protection glass material, said oxide layer containing a metal element and silicon. It is preferable that the oxide layer contains at least one metal element selected from the group consisting of magnesium, aluminum, titanium, vanadium, chromium, manganese, zirconium, niobium and
(Continued)

---

PROTECTION GLASS

ENCAPSULATING MATERIAL

OXIDE LAYER

ANTIREFLECTION FILM OR TRANSPARENT CONDUCTIVE FILM

SUBSTRATE molybdenum. It is also preferable that the oxide layer has a refractive index of from 1.5 to 2.3 (inclusive) with respect to incident light having a wavelength of 587 nm.

6 Claims, 3 Drawing Sheets

(51) Int. Cl.
*H01L 31/0216* (2014.01)
*H01L 31/0224* (2006.01)

(52) U.S. Cl.
CPC ........ *H01L 31/048* (2013.01); *H01L 31/0481* (2013.01); *H01L 31/0488* (2013.01); *H01L 31/1876* (2013.01); *Y02E 10/50* (2013.01)

(56) References Cited

U.S. PATENT DOCUMENTS

| | | | |
|---|---|---|---|
| 2001/0045505 | A1 | 11/2001 | Morizane et al. |
| 2006/0263610 | A1 | 11/2006 | Greenberg et al. |
| 2007/0261733 | A1 | 11/2007 | Hannour et al. |
| 2008/0308151 | A1* | 12/2008 | Den Boer ......... H01L 31/02168 136/256 |
| 2011/0146768 | A1* | 6/2011 | Lu ....................... C03C 17/3417 136/255 |
| 2014/0150850 | A1 | 6/2014 | Hwang |
| 2014/0252624 | A1 | 9/2014 | Huang et al. |
| 2015/0179852 | A1 | 6/2015 | Nagai et al. |

FOREIGN PATENT DOCUMENTS

| | | |
|---|---|---|
| JP | H06163955 A | 6/1994 |
| JP | 2001291881 A | 10/2001 |
| JP | 2014011270 A | 1/2014 |
| JP | 2014027034 A | 2/2014 |
| JP | 2014154675 A | 8/2014 |
| JP | 2014157874 A | 8/2014 |
| JP | 2014212318 A | 11/2014 |
| JP | 2014239104 A | 12/2014 |
| KR | 1020140058794 A | 5/2014 |
| WO | 2013159646 A1 | 10/2013 |
| WO | 2014057890 A1 | 4/2014 |

OTHER PUBLICATIONS

J. Zita et al., "Multilayer TiO2/SiO2 thin sol—gel films: Effect of calcination temperature and Na+ diffusion," Journal of Photochemistry and Photobiology A: Chemistry 216; 2010, pp. 194-200.

J.Bauer et al., "On the mechanism of potential-induced degradation in crystalline silicon solar cells," Rapid Reseach Letters; 2012, pp. 331-333, No. 8.

K. Hara et al, "Crystalline Si photovoltaic modules based on TiO2-coated cover glass against potential-induced degradation," Royal Society of Chemistry, 2014, pp. 44291-44295, No. 4.

P. Hacke et al, "Characterization of Multicrystalline Silicon Modules with System Bias Voltage Applied in Damp Heat," 25th European Photovoltaic Solar Energy Conference and Exhibition/5th World Conference on Photovoltaic Energy Conversion; Sep. 2010, pp. 3760-3765.

International Search Report corresponding to Application No. PCT/JP2015/085301; dated Mar. 8, 2016.

SIPO Office Action corresponding to Application No. 201580070529.3; dated Jun. 28, 2018.

Notification of Reasons for Refusal issued in the JP Patent Application No. JP2014-266406, dated Feb. 12, 2019.

* cited by examiner

FIG. 1

| PROTECTION GLASS |
| --- |
| ENCAPSULATING MATERIAL |
| OXIDE LAYER |
| ANTIREFLECTION FILM OR TRANSPARENT CONDUCTIVE FILM |
| SUBSTRATE |

FIG. 2

| PROTECTION GLASS |
| --- |
| OXIDE LAYER |
| ENCAPSULATING MATERIAL |
| ANTIREFLECTION FILM OR TRANSPARENT CONDUCTIVE FILM |
| SUBSTRATE |

SOLAR CELL MODULE AND METHOD FOR MANUFACTURING THE SAME

The present U. S. patent application is a U. S. National Phase Application under 35 U.S.C. 371 of International Application PCT/JP2015/085301 filed on Dec. 17, 2015. Priority under 35 U.S.C § 119(a) and 35 U.S.C. § 365(b) is claimed from Japanese Application No. 2014-266406 filed on Dec. 26, 2014, the entirety of which is incorporated herein by references.

TECHNICAL FIELD

The present invention relates to a solar cell module that can suppress performance degradation caused by potential induced degradation (PID) and a method of manufacturing the same.

BACKGROUND ART

As illustrated in FIG. 4, the solar cell module is composed of a plurality of solar cells and laminating the periphery thereof with a surface protection material (protection glass), an encapsulating material, and a back material (back sheet).

As a manufacturing process of a solar cell, for example, a texture structure is formed on the light receiving surface of a monocrystalline or polycrystalline silicon semiconductor substrate having a pn junction structure by using an alkaline solution, an antireflection film composed of silicon nitride is formed thereon by a chemical vapor deposition method, and thereafter, wiring is formed, thereby manufacturing a solar cell.

As a manufacturing process of a solar cell module, for example, a tab wire is soldered to a bus electrode on the surface of a solar cell to manufacture a string having a plurality of combined cells. Subsequently, both surfaces of the string are covered with an encapsulating material such as ethylene vinyl acetate (EVA), further, protection glass is laminated on the upper light receiving surface side and a back sheet is laminated on the back surface side. This laminated body is placed in a vacuum atmosphere at a reduced pressure and a high temperature and the encapsulating material is melted to paste and integrate the protection glass, the solar cell, and the back sheet, thereby manufacturing the solar cell module.

In addition, a transparent conductive film of indium tin oxide (ITO), zinc oxide (ZnO), or the like is formed on the light receiving surface of the semiconductor device, and the module is formed through the same manufacturing process as described above in some cases.

The solar cell module is fixed to a metal frame such as aluminum to be a panel. A plurality of panels are electrically connected, fixed to a frame, and installed outdoors. Systems that can generate electricity of the megawatt (MW) class by connecting a large number of panels have increased.

In this MW class power generation system, defects due to potential induced degradation (PID) frequently occur as a problem.

The condition under which the PID damage occurs is that this MW class power generation system is exposed to a high temperature and high humidity environment as well as the potential difference between both ends of the connected portion becomes several hundred volts or more since a large number of panels are connected.

The cause of the occurrence of PID damage is not yet clearly known. The PID damage is said to be caused because a large potential difference acts between the solar cell and the protection glass and sodium ions (Na+) contained in the protection glass diffuse to the outside from the protection glass due to the potential difference and accumulate on the surface of the antireflection film or the surface of the transparent electrode. For example, Non-Patent Document 1 proposes a model in which, as a result of the accumulation of Na+ ions on the surface of the antireflection film, electrons are attracted to the silicon substrate side of the antireflection film in order to maintain the neutral condition of charge, the surface of the silicon substrate located under the antireflection film is negatively charged, the n+ layer is locally inverted to the p+ layer, a leakage current is generated in the emitter layer, and the solar cell characteristics are degraded.

In order to suppress the PID damage, a method of improving the encapsulating material or a method of improving the protection glass has been conventionally proposed.

Examples in which the encapsulating material is improved are described below. Patent Document 1 proposes a method of suppressing the PID damage by increasing the thickness of the encapsulating material and designing the module so that the dielectric breakdown voltage is larger than the maximum system voltage. Patent Document 2 proposes a method in which a crosslinked cured film of a composition containing an ethylene-polar monomer copolymer and a crosslinking agent is used as the material for the encapsulating material, and the product of the volume resistivity and the thickness of the encapsulating material is set to be $5 \times 10^{13}$ $\Omega cm^2$ or more to enhance the insulation property, thereby suppressing the diffusion of Na+ ions. Patent Document 3 proposes a method in which an ionomer resin layer having a small water vapor permeation amount and a high electric resistance even in a high humidity environment, a transparent resin layer having irregularities on both surfaces, and an ethylene-acetic acid copolymer resin layer are laminated between the protection glass and the encapsulating material in this order, thereby suppressing the diffusion of Na+ ions. Patent Document 4 proposes a method in which a crosslinking agent composed of an organic peroxide and a stabilizing agent composed of an oligomer are contained in addition to an encapsulating material composed of an ethylene vinyl acetate copolymer to improve the electrical insulation property and moisture shielding property, thereby suppressing the diffusion of Na+ ions.

Examples in which the protection glass is improved are described below. Non-Patent Document 2 proposes a method in which quartz glass which does not contain Na+ ions is used as the protection glass instead of soda-lime glass or a method in which silicon oxide is formed on the surface of soda-lime glass to suppress the diffusion of alkali metals. Non-Patent Document 3 states that the diffusion of Na+ ions can be suppressed when a titanium oxide ($TiO_2$) film is formed on the surface of a protection glass by a wet method and the film thickness is 100 nm or more. However, the effect of suppressing PID is incomplete as degradation of the solar cell characteristics appears after a PID test has been conducted for 2 hours. Non-Patent Document 4 reports that the film framework exhibits a columnar crystal framework although a $TiO_2$ film having a film thickness of 1 μm is formed on the surface of the protection glass by the sputtering method, Na+ ions diffuse through the crystal grain boundaries, and it is thus impossible to suppress the PID damage. Non-Patent Document 5 reports that diffusion of Na+ ions can be delayed by further layering a $SiO_2$ film in addition to a $TiO_2$ film. Patent Document 5 proposes a method in which the Na+ ion concentration contained in the protection glass surface is set to 0.01 wt % or more and 13 wt % or less in terms of $Na_2O$ and the volume resistivity is set to $1.0 \times 10^{8.3}$ Ωcm or more. Patent Document 6 proposes a method in which the surfaces of the protection glass and the frame are coated with a hydrophobic film, thereby suppressing the dissolution of Na+ ions.

As another method, a method in which a transparent conductive film is formed on the antireflection film, the transparent conductive film and the back surface of the solar cell are electrically short-circuited and grounded, thereby preventing the accumulation of electric charges in the vicinity of the surface of the antireflection film, and the like are proposed as in Patent Document 7.

Patent Document 1: Japanese Unexamined Patent Application, Publication No. 2014-11270
Patent Document 2: Japanese Unexamined Patent Application, Publication No. 2014-27034
Patent Document 3: Japanese Unexamined Patent Application, Publication No. 2014-157874
Patent Document 4: Japanese Unexamined Patent Application, Publication No. 2014-212318
Patent Document 5: PCT International Publication No. WO2014/057890
Patent Document 6: U.S. Published Patent Application Publication, No. 2014/0150850, Specification
Patent Document 7: U.S. Pat. No. 7,786,375, Specification
Non-Patent Document 1: J. Bauer et al., Physica Status Solidi RRL, Vol. 6, pp. 331-333(2012)
Non-Patent Document 2: P. Hacke et al. Proceeding 25th EUPVSEC, pp. 3760-3765(2010)
Non-Patent Document 3: K. Hara et al., The Royal Society of Chemistry Advances, Vol. 4, pp. 44291-44295 (2014)
Non-Patent Document 4: E. Aubry et al., Surface & Coatings Technology, Vol. 206, pp. 4999-5005(2012)
Non-Patent Document 5: J. Zita et al., Journal of Photochemistry and Photobiology A: Chemistry, Vol. 216, pp. 194-200(2010)

DISCLOSURE OF THE INVENTION

Problems to be Solved by the Invention

As described above, it is required to prevent degradation of the power generation characteristics due to the PID damage in MW class photovoltaic power generation systems. However, the above-described conventional method is not sufficient for suppressing the PID damage, and an improvement method of further suppressing the PID damage has been desired in order to prolong the lifespan of MW systems.

The present invention has been made in view of such circumstances, and an object thereof is to provide a solar cell module capable of preventing the occurrence of PID damages in a MW class photovoltaic power generation system to be used in a high temperature and high humidity environment and a method of manufacturing a solar cell module.

Means for Solving the Problems

The present inventors have conducted intensive research in order to solve the problems as described above. As a result, it has been found that the above problem can be solved by forming an oxide layer having a specific composition between the substrate and the protection glass, whereby the present invention has been completed. Specifically, the present invention provides the following.

(1) The present invention is a solar cell module including a protection glass and an encapsulating material on a light receiving surface side of a substrate and an oxide layer containing a metal element and silicon between a substrate and a protection glass.

(2) The present invention is the solar cell module according to (1), in which the oxide layer contains at least one kind of metal element selected from the group consisting of magnesium, aluminum, titanium, vanadium, chromium, manganese, zirconium, niobium, and molybdenum.

(3) The present invention is the solar cell module according to (1), in which the oxide layer contains at least one kind of metal element selected from the group consisting of titanium, vanadium, chromium, and manganese.

(4) The present invention is the solar cell module according to (1), in which the oxide layer contains manganese as the metal element.

(5) The present invention is the solar cell module according to any one of (1) to (4), in which the oxide layer has a total concentration of the metal element and silicon of 20 atomic % or more and 70 atomic % or less.

(6) The present invention is the solar cell module according to any one of (1) to (5), in which the oxide layer has a concentration of the metal element to be equal to or more than a concentration of the silicon and equal to or less than 10 times the concentration of the silicon as atomic %.

(7) The present invention is the solar cell module according to any one of (1) to (6), in which the oxide layer has a refractive index of 1.5 or more and 2.3 or less with respect to incident light having a wavelength of 587 nm.

(8) The present invention is the solar cell module according to any one of (1) to (7), in which wherein the oxide layer has a thickness of 5 nm or more and 200 nm or less.

(9) The present invention is the solar cell module according to any one of (1) to (8), in which the oxide layer is formed on an antireflection film or a transparent conductive film provided on a surface on a light receiving surface side of a substrate.

(10) The present invention is the solar cell module according to any one of (1) to (8), in which the oxide layer is formed on a surface on an encapsulating material side of the protection glass.

(11) The present invention is a method of manufacturing a solar cell module, including a step of providing an antireflection film or a transparent conductive film on a surface on a light receiving surface side of a substrate, a step of providing an oxide layer containing a metal element and silicon on the antireflection film or the transparent conductive film, a step of providing an encapsulating material on the oxide layer, and a step of providing a protection glass on the encapsulating material, in which a thickness of the oxide layer is 5 nm or more and 200 nm or less and a refractive index of the oxide layer is 1.5 or more and 2.3 or less at an incident light wavelength of 587 nm.

(12) The present invention is the method of manufacturing a solar cell module according to (11), including a first step of coating the antireflection film or the transparent conductive film with a solution containing a metal element and silicon and a second step of calcining the coated film at a temperature of 200° C. or higher and 800° C. or lower in an atmosphere containing oxygen.

(13) The present invention is the method of manufacturing a solar cell module according to (11), including a first step of forming a film containing a metal element and silicon on the antireflection film or the transparent conductive film by a deposition method and a second step of calcining the film at a temperature of 200° C. or higher and 800° C. or lower in an atmosphere containing oxygen.

(14) The present invention is a method of manufacturing a solar cell module, including a step of providing an antireflection film or a transparent conductive film on a surface on a light receiving surface side of a substrate, a step of providing an encapsulating material on the antireflection film or the transparent conductive film, and a step of providing an oxide layer containing a metal element and silicon on a surface on a substrate side of the protection glass, in which a thickness of the oxide layer is 5 nm or more and 200 nm or less and a refractive index of the oxide layer is 1.5 or more and 2.3 or less at an incident light wavelength of 587 nm.

(15) The present invention is the method of manufacturing a solar cell module according to (14), including a first step of coating a surface of the protection glass with a solution containing a metal element and silicon and a second step of calcining the coated film at a temperature of 200° C. or higher and 500° C. or lower in an atmosphere containing oxygen.

(16) The present invention is the method of manufacturing a solar cell module according to (14), including a first step of forming a film containing a metal element and silicon on a surface of the protection glass by a deposition method and a second step of calcining the film at a temperature of 200° C. or higher and 500° C. or lower in an atmosphere containing oxygen.

Effects of the Invention

According to the present invention, it is possible to prevent the dissolution and diffusion of Na+ ions from the protection glass and thus to prevent the accumulation of Na+ ions on the surface of the antireflection film or the transparent conductive film provided on the substrate. Consequently, it is possible to provide a solar cell module which exhibits suppressed occurrence of the PID damage and excellent battery characteristics.

BRIEF DESCRIPTION OF THE DRAWINGS

FIG. 1 is a diagram which schematically illustrates an example of a mode in which an antireflection film or a transparent conductive film, an oxide layer, an encapsulating material, and a protection glass are laminated in this order on a substrate according to an embodiment of the present invention.

FIG. 2 is a diagram which schematically illustrates an example of a mode in which an antireflection film or a transparent conductive film, an encapsulating material, an oxide layer, and a protection glass are laminated in this order on a substrate according to an embodiment of the present invention.

FIG. 3(a) is a diagram which illustrates the results of a PID test of a module having an oxide layer, and FIG. 3(b) is a diagram which illustrates the results of a PID test of a conventional module not having an oxide layer.

PREFERRED MODE FOR CARRYING OUT THE INVENTION

Figure 3:
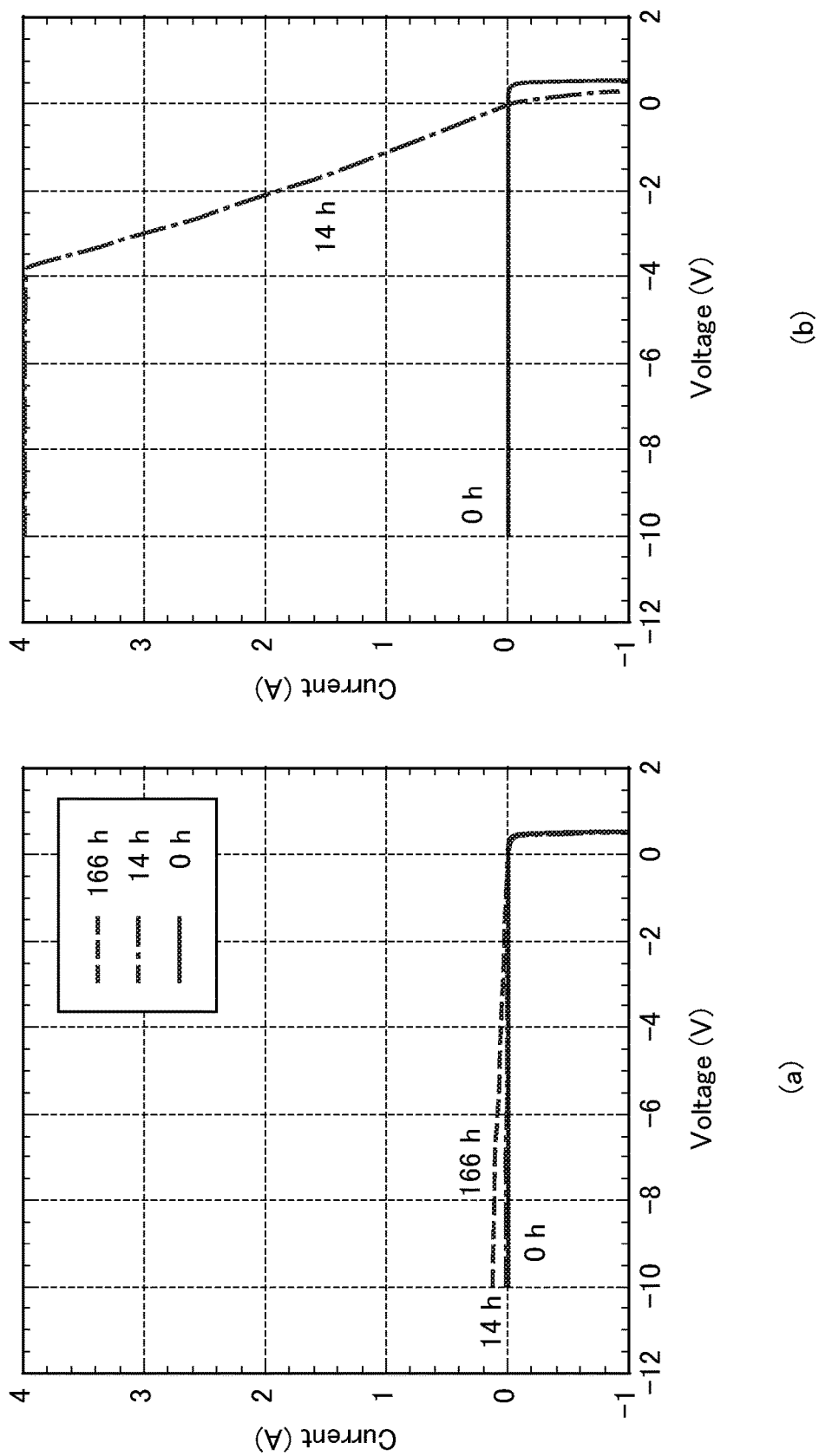
FIG. 3 illustrates the results of a PID test in Examples.
Figure 4:
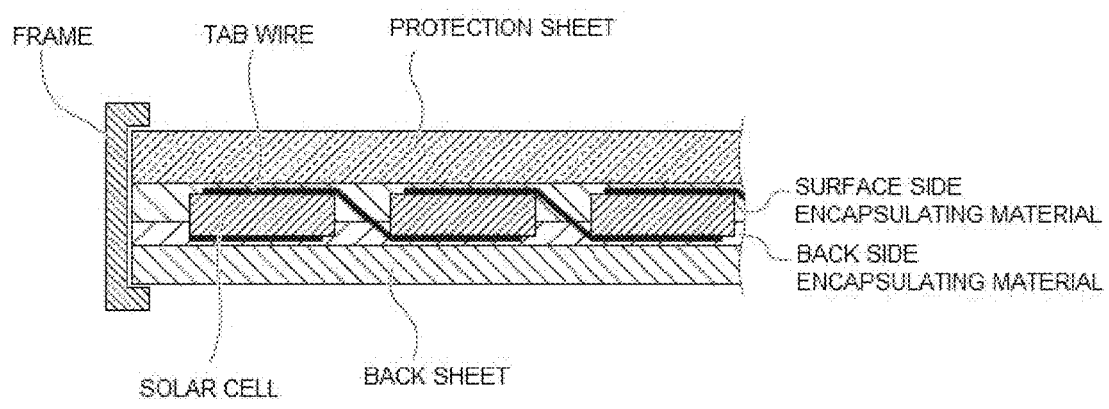
FIG. 4 is a diagram which illustrates a general structure of a solar cell module.

Hereinafter, the solar cell module of the present invention and the method of manufacturing the same will be described in detail. The present invention is not limited by these descriptions and can be implemented with appropriate modification within the scope of the object of the present invention.

A solar cell module is a module in which a plurality of solar cells using a semiconductor are disposed and encapsulated by using a supporting plate (a glass plate or the like), a filling material (an encapsulating material), and a back material (a back sheet) so as to withstand the surrounding environment and an outer frame is then attached and sealed in order to maintain overall strength.

(Substrate)

The solar cell module of the present invention uses a substrate formed of a semiconductor material such as monocrystalline silicon, polycrystalline silicon, amorphous silicon, CIS ($CuInSe_2$), CIGS ($Cu(In, Ga)Se_2$), or a CdTe compound as the substrate. The substrate may be one in which the impurity concentration distribution is adjusted in the semiconductor material having a band gap of 0.6 eV or more and 2.2 eV or less and a pn junction is formed.

(Antireflection Film)

In the present invention, an antireflection film may be provided on the surface of the substrate. As the antireflection film, a thin film of silicon nitride, manganese oxide, or the like or a film obtained by layering these thin films is preferable. For example, in the substrates formed of monocrystalline silicon and polycrystalline silicon, a thin film of silicon nitride can be formed on the substrate by plasma enhanced chemical vapor deposition (PECVD) to form an antireflection film.

(Transparent Conductive Film)

In the present invention, a transparent conductive film may be provided on the surface of the substrate. As the transparent conductive film, a thin film of indium tin oxide (ITO), zinc oxide (ZnO), or the like having an electrical resistivity of 50 μΩcm or more and 0.01 Ωcm or less is preferable. For example, in a substrate formed of a compound semiconductor such as amorphous silicon, CIS, CIGS, or CdTe, a thin film of indium tin oxide or zinc oxide is formed on the substrate by a sputter deposition method to form a transparent conductive film having an antireflection function.

(Oxide Layer)

The oxide layer in the present invention is composed of an oxide containing a metal element and silicon. The oxide layer containing a metal element and silicon has an effect of shielding the diffusion of Na+ ions from the protection glass to the outside. By disposing the oxide layer between the substrate and the protection glass, it is possible to prevent Na+ ions from accumulating on the surface of the antireflection film or the surface of the transparent conductive film provided on the substrate.

The metal element is preferably at least one kind of metal element selected from the group consisting of magnesium, aluminum, titanium, vanadium, chromium, manganese, zirconium, niobium, and molybdenum. These metal elements are elements having a strong chemical bonding force with silicon and oxygen, bind with silicon to form a silicon compound, and form a stable oxide. Oxides containing these metal elements and silicon have a dense structure. Hence, the oxide layer in the present invention has an excellent effect of shielding the diffusion of Na+ ions having a large ionic radius.

The metal element is more preferably at least one kind of metal element selected from the group consisting of titanium, vanadium, chromium, and manganese. Titanium, vanadium, chromium, and manganese are metal elements which have a particularly strong chemical bonding force with silicon and oxygen. The oxide layer containing these metal elements and silicon has a superior effect of shielding the diffusion of Na+ ions. In a case in which the potential which acts on the end portion of the solar cell power generation system reaches about 1000 V, it is still more preferable to contain at least one kind of metal element selected from the group consisting of titanium, vanadium, chromium, and manganese.

Manganese is a metal element which has a particularly strong chemical bonding force with silicon and oxygen. Hence, an oxide layer containing manganese and silicon has an excellent effect of shielding the diffusion of Na+ ions. In a case in which the potential which acts on the end portion of the solar cell power generation system exceeds 1000 V, it is still more preferable to contain manganese as the metal element.

The concentrations of the metal element and silicon contained in the oxide layer are such that the total concentration of the concentrations of both elements expressed as atomic % is 20 at. % or more and 70 at. % or less. The effect of shielding the diffusion of Na+ ions is not exerted when the total concentration is less than 20 at. %. In addition, when the total concentration is more than 70 at. %, oxygen vacancies increase to form a defect level and a tail level within the electron energy band gap of the oxide, to absorb incident light inside the oxide layer, and to decrease the intensity of incident light reaching the device substrate, and the conversion efficiency of the solar cell module thus decreases. In addition, the formation of the tail level is not preferable since the apparent band gap tends to decrease, the refractive index tends to excessively increase, and the intensity of the incident light reaching the device substrate decreases.

Furthermore, it is preferable that the concentration of the metal element is equal to or more than the concentration of silicon and equal to or less than 10 times the concentration of silicon as atomic %. When the concentration of the metal element is equal to or more than the concentration of silicon, the number of dangling bonds of silicon and oxygen exhibiting polarity decreases and the relative dielectric constant decreases making it possible for the refractive index of the oxide layer to decrease to 2.3 or less. In addition, it is not preferable that the atomic % concentration of the metal element exceeds 10 times the atomic % concentration of silicon since the concentration of silicon atoms is too low and the relative dielectric constant is extremely small so that the refractive index of the oxide layer is less than 1.5 and the absorptivity of incident light decreases.

It is preferable that the oxide layer has a refractive index of 1.5 or more and 2.3 or less with respect to incident light having a wavelength of 587 nm. By disposing an oxide layer having a refractive index in this range, favorable optical matching with the device substrate can be realized and the light radiated to the solar cell can efficiently reach the device substrate. It is not preferable that the refractive index is less than 1.5 since the reflectivity of infrared light increases and it is not preferable that the refractive index exceeds 2.3 since the reflectivity of ultraviolet light increases, so that the intensity of light reaching the device substrate is weak.

It is preferable that the oxide layer has a thickness of 5 nm or more and 200 nm or less. The effect of shielding the diffusion of Na+ ions disappears when the thickness of the oxide layer is less than 5 nm. The amount of incident light absorbed increases and the intensity of light reaching the device substrate decreases when the thickness of the oxide layer is more than 200 nm.

It is preferable that the oxide layer is formed on the antireflection film or the transparent conductive film provided on the surface on the light receiving surface side of the substrate. PID damages are caused when Na+ ions dissolved out from the protection glass diffuse toward the substrate and the Na+ ions accumulate in the vicinity of the surface opposite to the substrate on the antireflection film or the transparent conductive film provided on the substrate on the light receiving surface side of the substrate. In the present invention, the accumulation of Na+ ions can be prevented by forming an oxide layer on the antireflection film or the transparent conductive film.

It is preferable that the oxide layer is formed on the surface on the encapsulating material side of the protection glass. In the case of providing the encapsulating material on the substrate side of the protection glass, the formation of an oxide layer on the surface of the encapsulating material suppresses the dissolution and diffusion of Na+ ions from the surface of the protection glass and contributes to the prevention of PID damages.

(Formation of Oxide Layer)

The oxide layer can be formed by a wet method or a dry method. In the case of forming the oxide layer by a wet method, the surface to be coated is coated with a solution containing a metal element and silicon. In the case of forming the oxide layer by a dry method, a metal element and silicon are deposited on the surface to be coated. In both cases, the coated surface or the deposited surface is then calcined at a temperature of 200° C. or higher and 800° C. or lower in an atmosphere containing oxygen, whereby an oxide layer is obtained.

In the present invention, the oxide layer can be formed by a wet method in which a raw material solution is coated. It is preferable to include a first step of coating a solution containing a metal element and silicon and a second step of calcining the coated solution at a temperature of 200° C. or higher and 800° C. or lower in an atmosphere containing oxygen.

The coated film converts to an oxide layer by being calcined in an atmosphere containing oxygen. At this time, there is the concern that volatile components in the solution are not sufficiently removed and remain in the oxide when the coated film is calcined at a temperature lower than 200° C. In addition, the metal element and silicon in the oxide are separated and an oxide with the metal, silicon, and oxygen in a composite bonding state is hardly formed when the coated film is calcined at a temperature higher than 800° C. Hence, it is difficult to obtain an oxide layer having an effective effect of shielding the diffusion of Na+ ions.

As the coating solution to be used in the wet method, it is possible to use a solution in which a metal complex and a silane coupling agent are dissolved in an organic solvent. Examples of the titanium complex may include ethene-1,2-diyl bis(tert-butylamido)diisopropoxide titanium, ethene-1, 2-diylbis(tert-butylamido)bis(tert-pentyloxy) titanium, ethene-1,2-diyl bis(tert-pentylamido)diisopropoxide titanium. Examples of the vanadium complex may include vanadium acetylacetonate, vanadyl acetylacetonate, vanadyl stearate, vanadium naphthenate, and vanadium benzoylacetonate. Examples of the chromium complex may include hexacarbonylchromium. Examples of the manganese complex may include manganese(II) acetate, manganese(II) butyrate, manganese(II) octoate, manganese(II) hexanoate, manganese(II) ethylhexanoate, manganese(II) acetylacetonate, manganese(II) oleate, manganese(II) carbonyl, cyclopentadienyl manganese tricarbonyl, cyclopentadienyl manganese dicarbonyl, and cyclopentadienyl isocyanocyclohexane manganese dicarbonyl.

Examples of the silane coupling agent may include vinyltrimethoxysilane, vinyltriethoxysilane, 2-(3,4-epoxycyclohexyl)ethyltrimethoxysilane, and 3-glycidoxypropylmethylsimethoxysilane, for example, as the silane coupling agent having a vinyl-based functional group. In addition to these, it is possible to use a silane coupling agent having an epoxy-based functional group, a silane coupling agent having a styryl-based functional group, a silane coupling agent having a methacrylic functional group, or the like. As the solvent, it is possible to use aromatic hydrocarbons such as benzene, toluene, and xylene; chain and cyclic aliphatic hydrocarbons such as heptane and cyclohexane; halogenated hydrocarbons such as chlorobenzene, dichlorobenzene, and dichloromethane; nitriles such as acetonitrile and benzonitrile; alcohols such as methanol, ethanol, propyl alcohol, and isopropyl alcohol; ethers such as dioxane, tetrahydrofuran, and ethylene glycol dimethyl ether, amides such as N,N-dimethylformamide and N-methylpyrrolidone; nitro compounds such as nitromethane and nitrobenzene, water, and the like. These raw materials are weighed in appropriate amounts and mixed together to prepare a coating solution. A coating film is formed by coating the surface of the substrate or protection glass with the solution by using a general method such as a spray coating method, a dip coating method, a spin coating method, a slit coating method, or an inkjet method as the coating method.

In the present invention, a dry method (deposition method) can be used for the formation of the oxide layer. It is preferable to include a first step of forming a film containing a metal element and silicon by deposition and a second step of calcining the film at a temperature of 200° C. or higher and 800° C. or lower in an atmosphere containing oxygen.

The deposited film containing a metal element and silicon converts to an oxide layer by being calcined in an atmosphere containing oxygen. At this time, the degree of oxidation of the deposited film is insufficient and a sufficient effect of shielding the diffusion of Na+ ions is not obtained when the temperature for calcination is lower than 200° C. The metal element and silicon in the oxide are separated and an oxide with the metal, silicon, and oxygen in a composite bonding state is hardly formed when the temperature for calcination is higher than 800° C. Hence, it is difficult to obtain an oxide layer having an effective effect of shielding the diffusion of Na+ ions.

For the dry method, it is possible to use a deposition method such as a sputtering method, an electron beam evaporation method, a chemical vapor deposition (CVD) method, or a mist CVD method. For example, in the case of using a sputtering method, plate-shaped targets of a metal element and silicon are prepared and a thin layer of the metal element and silicon is deposited on the surface of the substrate or the protection glass by a high-frequency magnetron sputtering method in argon gas to form a deposited film.

As described above, the coating film or the deposited film is calcined in an atmosphere containing oxygen to be converted into an oxide. The oxygen concentration in the atmosphere may be 500 ppm or more, and ordinary atmospheric gas may be used as the atmospheric gas. In addition, an inert gas such as nitrogen or argon may be contained in the atmosphere. In the case of forming an oxide layer on the substrate, the temperature for calcination may be 200° C. or higher and 800° C. or lower and is preferably 300° C. or higher and 600° C. or lower, more preferably 350° C. or higher and 500° C. or lower. In the case of forming an oxide layer on the protection glass, the temperature for calcination is preferably 200° C. or higher and 500° C. or lower. The time for calcination is preferably from 30 seconds to 10 minutes.

(Protection Glass)

The protection glass is provided in order to protect the solar cell from the outside environment such as wind and rain and dust. As a glass material, general soda-lime glass (soda lime glass), white plate glass having a lower iron content than soda-lime glass, and the like are used. In order to suppress the reflection of incident light, satin-shaped irregularities are imparted to the surface on the light receiving surface side of the protection glass.

(Encapsulating Material)

The encapsulating material melts by being heated to exhibit transparency and a pressure sensitive adhesive property and is utilized for securing the close adhesive property between the solar cell and the protection glass. A copolymer such as ethylene vinyl acetate (EVA) can be used.

(Manufacture of Solar Cell Module)

In the present invention, a solar cell module in which an oxide layer is disposed on the substrate is provided, for example, as illustrated in FIG. 1. Specifically, grid wiring and an antireflection film or a transparent conductive film are formed on a substrate on which a pn junction is formed and an oxide layer containing a metal element and silicon is then formed on the film to obtain a solar cell. Soldering of the tab wire may be conducted before or after forming the oxide layer. Thereafter, both surfaces of the solar cell are covered with an EVA encapsulating material and a protection glass and a back sheet are disposed at the outermost portion to fabricate a multilayer structure. Thereafter, the multilayer structure is encapsulated by being heated and pressurized under reduced pressure by using a high temperature vacuum laminating apparatus to obtain a solar cell module.

In the present invention, a solar cell module in which an oxide layer is disposed on the substrate side of the protection glass is provided, for example, as illustrated in FIG. 2. Specifically, an oxide layer containing a metal element and silicon is formed on the surface of the protection glass in advance to fabricate a protection glass provided with a PID preventing means. In addition, grid wiring and an antireflection film or a transparent conductive film are formed on a semiconductor device on which a pn junction is formed to obtain a solar cell. Thereafter, soldering of the tab wire is conducted, both surfaces of the solar cell are then covered with an EVA encapsulating material, and the protection glass and the back sheet are disposed on the outermost portion to fabricate a multilayer structure. Thereafter, in the same manner as the above, the multilayer structure is encapsulated by using a high temperature vacuum laminating apparatus to obtain a solar cell module.

The characteristics of the solar cell module fabricated in this manner were evaluated by conducting the following tests and measurements.

(Measurement of Film Thickness, Composition, and Refractive Index of Oxide Layer)

In order to evaluate the optical characteristics of the oxide layer, the film thickness and the refractive index of the oxide layer were measured. A sample was fabricated by forming an oxide layer on a flat monocrystalline silicon substrate by a dry method or a wet method. The cross section of the sample was observed through a transmission electron microscope and the film thickness of the oxide layer was measured. Furthermore, the refractive index depending on the wavelength of incident light was measured by using the sample and a spectroscopic ellipsometer. In addition, the composition of the oxide layer was measured by Auger electron spectroscopy.

(PID Test)

In order to evaluate the PID characteristics of the solar cell module, a PID test was conducted. The specimen was prepared as follows. In the solar cell module, an aluminum plate was pasted onto the outer surface of the protection glass and connected to the first external electrode. Furthermore, the respective tab wires soldered to the bus electrode on the light receiving surface and the back surface of the solar cell were respectively electrically short-circuited and connected to the second external electrode. Such a solar cell module was used as a specimen. Upon conducting the PID test, the first external electrode was set to ground potential (0 V) and −1000 V was applied to the second external electrode. The specimen was placed in a test apparatus provided with a high temperature and high humidity atmosphere at a temperature of 85° C. and a relative humidity of 85% RH and held for a predetermined time. Generally, such a test is referred to as the "PID test". A feature of the PID test is that a high voltage is applied between the protection glass and the solar cell in addition to the conventional high temperature and high humidity durability test condition of exposing the solar cell module to an atmosphere at 85° C. and 85% RH. In the PID test, the leakage current and conversion efficiency were measured by using the specimen after a predetermined time elapsed.

(Measurement of Leakage Current)

After a certain period of time elapsed, the specimen was taken out of the test apparatus, the external electrodes for the PID test were removed from the specimen, and the respective tab wires on the light receiving surface and the back surface were separated from the short-circuited state. Thereafter, a voltage was applied between the tab wires on the light receiving surface and the back surface in the absence of light irradiation, and the change in current was measured. By this change in current, the rectifying characteristics of the cells in the solar cell module can be evaluated. In a case in which the semiconductor device is healthy, a large current flows under the forward bias condition but almost no current flows under the reverse bias condition. On the other hand, a remarkable leakage current is observed even under the reverse bias condition when the PID damage occurs in the semiconductor device.

(Measurement of Conversion Efficiency)

The photovoltaic cell was irradiated with light using a commercially available solar simulator, and the current was measured by applying a voltage by using the upper and lower tab wires of the solar cell as terminals. This measurement was conducted under the standard condition (incident light intensity=1000 W/m$^2$, measurement temperature: 25° C.). The conversion efficiency was calculated by dividing the value at which the product of the voltage and the current density is the maximum, that is, the generated electric power per square meter (W/m$^2$) is the maximum by 1000 W/m$^2$ of the incident light intensity under the standard test condition from the voltage (V) versus current density (A/m$^2$) curve thus obtained.

(Determination Criteria)

The leakage current was evaluated based on the leakage current value measured when the voltage was −5.0 V under the reverse bias condition after 14 hours from the start of the PID test. Hereinafter, this value is referred to as the "reference leakage current". In addition, the conversion efficiency was evaluated based on the proportion ((A−B)/A) decreased between the conversion efficiency (A %) before the PID test and the conversion efficiency (B %) after 14 hours from the start of the PID test. Hereinafter, this value is referred to as the "reference decreasing rate". As the determination criteria, it was determined to be favorable when the reference leakage current was 0.5 A or less and the reference decreasing rate was 3% or less.

EXAMPLES

Hereinafter, the present invention will be described in more detail with reference to Examples, but the present invention is not limited by these Examples.

Example 1

As a monocrystalline silicon semiconductor substrate, a monocrystalline p-type silicon wafer having a length of 156 mm, a width of 156 mm, and a thickness of 0.2 mm was used. The p-type impurity was boron (B). The upper surface of this wafer was etched with a KOH solution to form a textured framework having an irregular shape. Subsequently, the upper surface of the wafer was coated with $POCl_3$, then phosphorus (P) was diffused into the silicon through heat treatment at a high temperature to form an n+ region, thereby fabricating a monocrystalline silicon semiconductor device having a pn junction.

Next, a silicon nitride film was formed on the surface of the substrate on the light receiving surface side on which a textured surface was formed at a thickness of 60 nm by plasma enhanced chemical vapor deposition. Thereafter, silver paste and aluminum paste were printed and dried for the formation of the electrode. Thereafter, heat treatment was conducted at 800° C. for 3 seconds in the air atmosphere, thereby fabricating a monocrystalline silicon solar cell having a grid electrode and an antireflection film.

The raw material solution for forming the oxide layer was prepared by dissolving 2.0 moles of manganese(II) acetate and 1.0 mole of vinyl triethoxysilane in 1 liter of isopropyl alcohol. The entire surface of the light receiving surface of the solar cell was coated with this raw material solution by a spin coating method. Subsequently, the coated film was dried at 50° C. for 10 minutes in the air, subjected to heat treatment at 500° C. for 5 minutes to form an oxide layer containing manganese and silicon at a thickness of 20 nm, thereby fabricating a solar cell having an oxide layer. The atomic % concentration ratio of the oxide layer was Mn:Si:O=34:18:48. Incidentally, a solar cell not having an oxide layer was also fabricated for comparison.

In order to measure the optical characteristics of this oxide layer, the surface of a flat monocrystalline silicon substrate was coated with a raw material solution by a spin coating method, and the coated film was subjected to drying and heat treatment under the same conditions as the above to form an oxide layer. The refractive index of the oxide layer was measured by using a spectroscopic ellipsometer. The refractive index at a wavelength of 587 nm was 2.05. This value was the same level as that of silicon nitride of the antireflection film. Hence, it is preferable to form the film by decreasing the thickness of the usual silicon nitride film by the thickness of the oxide layer when a silicon nitride film is formed by plasma enhanced chemical vapor deposition. This makes it possible to have optimized reflectivity and transmittance of incident light.

Next, the surface of the bus electrode of the solar cell was coated with a solder flux and the tab wire was soldered. Thereafter, soda-lime glass, EVA, solar cell, EVA, and back sheet were stacked in this order to form a laminate structure. The laminate was encapsulated by using a high temperature vacuum laminator, thereby obtaining a solar cell module.

With regard to the solar cell module thus obtained, current and voltage produced by the solar cell in the solar cell module were measured and the rectification characteristics of the solar cell were evaluated in three stages of (i) before the PID test, (ii) after 14 hours from the start of the PID test, (iii) after 166 hours from the start of the PID test. The results are illustrated in FIG. 3.

FIG. 3(a) illustrates a solar cell module with an oxide layer to prevent PID. After 166 hours from the start of the PID test, only a weak leakage current was observed in the negative voltage region (under reverse bias conditions), and the reference leakage current was 0.08 A. This leakage current was observed even without applying a high voltage of −1000 V, and it is thus considered not to be caused by the application of a high voltage in the PID test but as a change in characteristics due to exposure to a high temperature and high humidity environment at a temperature of 85° C. and a relative humidity of 85% RH.

Consequently, with regard to the PID damage caused by the application of a high voltage, it was possible to completely prevent the PID damage of the solar cell module by forming the oxide layer corresponding to the present invention. In addition, the conversion efficiency of the solar cell module was 16.7% before the PID test and 16.5% after 14 hours from the start of the PID test. The relative efficiency decrease was (16.7−16.5)/16.7×100=1.2%, and the output characteristics of the solar cell module were thus almost maintained.

FIG. 3(b) illustrates the results of a test by a solar cell module without an oxide layer, which has the same structure as a conventional module. After 14 hours from the start of the PID test, significant leakage current was observed under the reverse bias condition and the PID damage occurred. The conversion efficiency of the solar cell module was 16.5% before the PID test and 4% after 14 hours from the start of the PID test, the output characteristics of the solar cell module was greatly degraded.

Example 2

A solar cell was fabricated according to the same procedure as in Example 1. Thereafter, a film was formed on the entire surface of the light receiving surface of the solar cell by a sputtering method. By using manganese and silicon sputter targets and controlling the input power to each target, manganese and silicon were deposited on the film while controlling the composition ratio of manganese:silicon=2:1 in atomic % to form a thin alloy film having a thickness of 15 nm. Subsequently, the thin alloy film was subjected to heat treatment at 400° C. for 5 minutes in the air, thereby forming an oxide layer which contained manganese and silicon and had a thickness of 24 nm. The atomic % concentration ratio in the oxide layer was Mn:Si:O=28:14:58.

Next, the surface of the bus electrode of the solar cell was coated with a solder flux and the tab wire was soldered. Thereafter, soda-lime glass, EVA, solar cell, EVA, and back sheet were stacked in this order to form a laminate structure. The laminate was encapsulated by using a high temperature vacuum laminator, thereby obtaining a solar cell module.

With regard to the specimen of the solar cell module thus obtained, the characteristics of the solar cell before and after the PID test were measured. In the same manner as in the current-voltage change illustrated in FIG. 3(a) of Example 1, a weak leakage current which was not caused by the PID damage was observed after 166 hours from the start of the PID test under the reverse bias condition. The reference leakage current was 0.01 A. From this fact, it has been revealed that an oxide layer formed by a deposition method has an effect of preventing the PID damage. In addition, the conversion efficiency of the solar cell module was 16.4% before the PID test, 16.3% after 14 hours from the start of the PID test, and the relative decreasing rate was 0.6%. Degradation of the output characteristics was negligibly small and a favorable PID preventing effect was exerted.

Example 3

The influence of the thickness of the oxide layer containing a metal element and silicon was investigated. An oxide layer composed of manganese and silicon was formed by a sputtering method according to the same procedure as in Example 2 except the thickness. By changing the sputtering time, alloy films composed of manganese and silicon with different thicknesses were obtained. Thereafter, the alloy films were subjected to heat treatment to form an oxide layer according to the same procedure as in Example 2 except the thickness, thereby fabricating specimens of solar cell modules having different thicknesses of the oxide layer. These specimens were subjected to the PID test, and the leakage current and conversion efficiency of the solar cell module were measured.

As the determination criteria, those corresponding to "favorable" (a reference leakage current of 0.5 A or less and a relative decreasing rate of 3% or less) were denoted by "○". The results of the test are presented in Table 1.

As presented in Table 1, in the solar cell module in which the thickness of the oxide layer was 5 nm or more and 200 nm or less, a favorable effect of suppressing the occurrence of the PID damage was obtained in terms of both the leakage current and the conversion efficiency. Hence, the thickness of the oxide layer is preferably 5 nm or more and 200 nm or less.

TABLE 1

| | Thickness of oxide layer (nm) | | | | | | | | | | | | |
|---|---|---|---|---|---|---|---|---|---|---|---|---|---|
| | 2 | 4 | 5 | 8 | 12 | 24 | 60 | 120 | 150 | 200 | 250 | 300 | 350 |
| Reference leakage current (A) | 1.2 | 0.81 | 0.38 | 0.15 | 0.08 | 0.01 | 0.01 | 0.01 | 0.02 | 0.01 | 0.01 | 0.02 | 0.01 |
| Relative decreasing rate (%) | 4.6 | 3.4 | 2.8 | 1.4 | 1.0 | 0.6 | 1.2 | 1.2 | 2.1 | 2.9 | 4.0 | 10 | 16 |
| Evaluation | | | ○ | ○ | ○ | ○ | ○ | ○ | ○ | ○ | | | |

In addition, a solar cell module with an oxide layer formed by a wet method was fabricated as in Example 1. Specimens having oxide layers of different thicknesses were fabricated by preparing a raw material solution having a fixed concentration ratio of the manganese complex to the silane coupling agent of 2:1, repeating the coating and drying steps of the raw material solution, and finally baking the coated film and subjected to the measurement of I-V characteristics. With regard to the specimens having an oxide layer fabricated by a wet method, a favorable result of suppressing the PID damage was obtained in terms of both the leakage current and the conversion efficiency when the thickness of the oxide layer was 5 nm or more and 200 nm or less in the same manner as in Example 3.

Example 4

Specimens of solar cell modules having an oxide layer containing manganese and silicon were fabricated according to the same procedure as in Example 2 except the manganese concentration and the silicon concentration, and the influence of the concentration ratio of metal element to silicon was investigated. By changing the input power to the manganese target and the silicon target at the time of sputtering film formation, oxide layers having a constant film thickness (about 20 nm) and containing manganese and silicon at different compositions were formed on a predetermined substrate, thereby obtaining specimens. A flat silicon substrate was used for the measurement of refractive index. In the PID test, a silicon substrate having a texture was used. The results of the measurement are presented in Table 2.

As presented in Table 2, in a case in which the manganese concentration in atomic % is higher than the silicon concentration and equal to or less than 10 times the silicon concentration, the refractive index at a wavelength of 587 nm is 2.3 or less and 1.5 or more. In addition, favorable characteristics maintaining the conversion efficiency after the PID test were obtained. Consequently, it is preferable that the manganese concentration is higher than the silicon concentration for suppressing the PID damage.

TABLE 2

|  | Mn concentration (at. %) | | | | | | |
| --- | --- | --- | --- | --- | --- | --- | --- |
|  | 5 | 15 | 25 | 35 | 45 | 50 | 70 |
| Si concentration (at. %) | 45 | 35 | 25 | 15 | 5 | 5 | 5 |
| Refractive index | 2.8 | 2.6 | 2.3 | 2.0 | 1.8 | 1.6 | 1.3 |
| Relative decreasing rate (%) | 3.9 | 3.6 | 2.8 | 0.95 | 0.92 | 1.9 | 3.4 |
| Evaluation |  |  | ○ | ○ | ○ | ○ |  |

In addition, the influence of the concentration ratio of manganese to silicon was investigated by using a specimen of a solar cell module in which an oxide layer was formed by a wet method as in Example 1. Specimens having oxide layers having the same concentration ratio as in Table 2 were fabricated by preparing raw material liquids having changed concentrations of the manganese complex and the silane coupling agent and coating, drying, and calcining the raw material liquids on a silicon substrate and subjected to the measurement of predetermined characteristics. With regard to the specimens having an oxide layer fabricated by a wet method as well, a favorable result that the refractive index was 1.5 or more and 2.3 or less and the reference decreasing rate of conversion efficiency was maintained at 3% or less after the PID test was obtained in a case in which the manganese concentration as atomic % was higher than the silicon concentration and equal to or less than 10 times the silicon concentration in the same manner as in Example 4.

Example 5

The influence of the total concentration of the metal element concentration and silicon concentration was investigated. Specimens of solar cell modules having an oxide layer containing manganese and silicon were fabricated according to the same procedure as in Example 2 except the manganese concentration and the silicon concentration. By changing the input power to the manganese target and the silicon target at the time of sputtering film formation, oxide layers which had a constant film thickness (about 20 nm) and a constant composition ratio of manganese:silicon (about 2:1) and contained manganese and silicon at different total compositions were formed on a predetermined substrate, thereby obtaining specimens. A flat silicon substrate was used for the measurement of refractive index. In the PID test, a silicon device substrate having a texture was used. The results of the measurement are presented in Table 3.

As presented in Table 3, the refractive index at a wavelength of 587 nm was 1.5 or more and 2.3 or less and the conversion efficiency was maintained after the PID test in a case in which the total concentration (Mn+Si) of the manganese concentration and the silicon concentration was 20 at. % or more and 70 at. % or less. In order to suppress the PID damage, it is preferable that the total concentration of the manganese concentration and the silicon concentration is 70 at. % or less.

TABLE 3

|  | Mn concentration (at. %) | | | | | |
| --- | --- | --- | --- | --- | --- | --- |
|  | 60 | 50 | 45 | 30 | 15 | 10 |
| Si concentration (at. %) | 30 | 25 | 25 | 15 | 7 | 6 |
| Mn + Si (at. %) | 90 | 75 | 70 | 45 | 22 | 16 |
| Refractive index | 1.31 | 1.43 | 1.52 | 2.20 | 2.25 | 2.85 |
| Relative decreasing rate (%) | 3.5 | 3.2 | 2.7 | 0.9 | 2.6 | 3.3 |
| Evaluation |  |  | ○ | ○ | ○ |  |

In addition, the influence of the total concentration of the manganese concentration and the silicon concentration was investigated by using specimens of solar cell modules in which an oxide layer was formed by a wet method as in Example 1. Raw material solution were prepared by changing the concentrations of the manganese complex and the silane coupling agent so as to have a constant total concentration of the manganese concentration and the silicon concentration, and specimens having an oxide layer having the same concentration ratio as in Table 3 were fabricated by coating, drying, and calcining the raw material solution on a silicon substrate and subjected to the measurement of I-V characteristics. With regard to the specimens having an oxide layer fabricated by a wet method as well, a favorable result that the refractive index was 1.5 or more and 2.3 or less and the conversion efficiency was maintained after the PID test was obtained in a case in which the manganese concentration was higher than the silicon concentration and equal to or less than 10 times the silicon concentration in the same manner as in Example 4.

Example 6

A solar cell was fabricated according to the same procedure as in Example 1. In addition, a protection glass subjected to a pickling treatment was prepared, and manganese and silicon were deposited on the entire glass surface on the solar cell side of the protection glass by a sputtering method such that the composition ratio of manganese:silicon=2:1 in atomic % to form a thin film having a thickness of 15 nm. Thereafter, the deposited film was subjected to heat treatment at 300° C. for 5 minutes in the air to form an oxide layer which contained manganese and silicon and had a thickness of 24 nm, thereby fabricating a protection glass having the oxide layer.

Next, this protection glass was placed on the uppermost surface, and a laminate in which EVA, a solar cell, EVA, and a back sheet were laminated in this order was fabricated under the protection glass. The laminate was encapsulated by using a high temperature vacuum laminator, thereby fabricating a specimen of a solar cell module.

The leakage current and conversion efficiency of the solar cell module were measured by using this specimen by the same method as in Example 3, and the solar cell module was evaluated based on the reference leakage current and the reference decreasing rate. As a result, the reference leakage current was 0.12 A and the reference decreasing rate was 0.8%. A favorable effect of suppressing the occurrence of the PID damage was exhibited.

Example 7

A specimen of a solar cell module was fabricated according to the same procedure as in Example 6 except that the oxide layer on the surface of the protection glass was formed by a wet method and subjected to the measurement of leakage current and conversion efficiency. As the oxide layer, an oxide layer having a thickness of 54 nm was formed by coating the glass surface with the raw material solution of Example 1 by using a slit coater and drying and subjecting the coated film to heat treatment. In this specimen, the reference leakage current was 0.18 A and the reference decreasing rate was 2.3%. A favorable effect of suppressing the occurrence of the PID damage was exhibited.

Example 8

A solar cell module was fabricated according to the same procedure as in Example 6 except that a metal element other than manganese was selected as the metal element contained in the oxide layer on the surface of the protection glass. The selected metal element is Fe and Zn having small silicide formation energy and Co and Ni having small oxide formation energy in addition to the element group (Mg, Al, Ti, V, Cr, Mn, Zr, Nb, and Mo) having high formation energy of both a silicide and an oxide. Specimens of solar cell modules in which an oxide layer containing each metal element and silicon was respectively formed were fabricated and subjected to the PID test. The results of the PID test are presented in Table 4 for each metal element used.

As presented in Table 4, all of the specimens using the respective metal elements of Mg, Al, Ti, V, Cr, Mn, Zr, Nb, and Mo exhibited a favorable effect of suppressing the occurrence of the PID damage. Among them, Ti, V, Cr, and Mn are more preferable since the reference decreasing rate of conversion efficiency is small. A favorable effect of suppressing the occurrence of the PID damage was obtained in the same manner even when two or more kinds of the respective metal elements described above were mixed. In addition, the oxide layer may be formed by a wet method. In addition, the oxide layer may be formed on the antireflection film or the transparent conductive film of the solar cell by a dry method or a wet method.

TABLE 4

| | Metal element | | | | | | | | | | | | |
|---|---|---|---|---|---|---|---|---|---|---|---|---|---|
| | Mg | Al | Ti | V | Cr | Mn | Zr | Nb | Mo | Fe | Co | Ni | Zn |
| Reference leakage current (A) | 0.06 | 0.05 | 0.07 | 0.12 | 0.08 | 0.01 | 0.06 | 0.07 | 0.13 | 0.62 | 0.54 | 0.81 | 0.47 |
| Relative decreasing rate (%) | 2.3 | 1.7 | 0.5 | 0.9 | 1.0 | 0.6 | 1.5 | 1.4 | 1.9 | 6.1 | 12 | 9.3 | 8.2 |
| Evaluation | ○ | ○ | ○ | ○ | ○ | ○ | ○ | ○ | ○ | | | | |

Example 9

Next, a solar cell module was fabricated by forming an oxide layer containing molybdenum and silicon on the antireflection film or transparent conductive film formed on a semiconductor substrate according to the same procedure as in Example 1 except that a semiconductor substrate other than a monocrystalline silicon semiconductor was selected and subjected to the PID test. As the semiconductor substrate, polycrystalline silicon, amorphous silicon, CIS, CIGS, and a CdTe compound were used. In addition, solar cell modules were fabricated by combining these semiconductor substrates and a protection glass in which an oxide layer containing manganese and silicon was formed on the glass surface and subjected to the PID test. In each of the solar cell modules thus fabricated, the reference leakage current and the reference decreasing rate were in favorable ranges.

As described above, the oxide layer found out in the present invention can effectively prevent the diffusion of Na+ ions in a case in which a high voltage is applied under a high temperature and high humidity environment, and an excellent PID preventing effect is thus exerted without being limited to the kind of the semiconductor material.

The invention claimed is:
1. A solar cell module comprising:
a solar cell comprising a semiconductor substrate;
a protection glass and an encapsulating material on a light receiving surface side of the semiconductor substrate; and
an oxide layer containing a metal element and silicon between the semiconductor substrate and the protection glass, wherein the oxide layer contains manganese as the metal element; and wherein the oxide layer has a total concentration of the manganese and silicon of 20 atomic %-70 atomic %.

2. The solar cell module according to claim 1, wherein the oxide layer has a concentration of the manganese that is 1-10 times the concentration of the silicon in atomic %.

3. The solar cell module according to claim 1, wherein the oxide layer has a refractive index of 1.5-2.3 with respect to incident light having a wavelength of 587 nm.

4. The solar cell module according to claim 1, wherein the oxide layer has a thickness of 5 nm-200 nm.

5. The solar cell module according to claim 1, wherein the oxide layer is formed on an antireflection film or a transparent conductive film provided on a surface on the light receiving surface side of the semiconductor substrate.

6. The solar cell module according to claim 1, wherein the oxide layer is formed on a surface on an encapsulating material side of the protection glass.

* * * * *